United States Patent
Floyd et al.

(10) Patent No.: US 7,697,296 B2
(45) Date of Patent: Apr. 13, 2010

(54) METHOD AND APPARATUS FOR SECURING A MICROPROCESSOR AND HEAT SINK USING FEWER MOUNTING HOLES

(75) Inventors: Michael Richard Floyd, Wake Forest, NC (US); Peter Andrew Smith, Cary, NC (US)

(73) Assignee: International Business Machines Corporation, Armonk, NY (US)

(*) Notice: Subject to any disclaimer, the term of this patent is extended or adjusted under 35 U.S.C. 154(b) by 191 days.

(21) Appl. No.: 11/780,731

(22) Filed: Jul. 20, 2007

(65) Prior Publication Data

US 2009/0021917 A1 Jan. 22, 2009

(51) Int. Cl.
*H05K 7/20* (2006.01)
*F28F 7/00* (2006.01)

(52) U.S. Cl. .............. 361/719; 361/679.54; 361/702; 361/704; 361/709; 165/80.3

(58) Field of Classification Search ............ 361/679.46, 361/679.48, 679.54, 690, 694–697, 702–704, 361/709–710, 719; 439/485, 487; 165/80.3, 165/185
See application file for complete search history.

(56) References Cited

U.S. PATENT DOCUMENTS

| | | | |
|---|---|---|---|
| 5,344,334 A | 9/1994 | Laub et al. | |
| 6,084,178 A * | 7/2000 | Cromwell | 174/383 |
| 6,198,630 B1 | 3/2001 | Cromwell | |
| 6,400,577 B1 | 6/2002 | Goodwin et al. | |
| 6,545,879 B1 | 4/2003 | Goodwin | |
| 6,639,800 B1 * | 10/2003 | Eyman et al. | 361/704 |
| 6,776,625 B2 | 8/2004 | Ma | |
| 6,776,642 B1 | 8/2004 | McHugh et al. | |
| 7,042,727 B2 | 5/2006 | Ulen et al. | |
| 7,046,516 B2 * | 5/2006 | Lee et al. | 361/704 |
| 7,365,987 B2 * | 4/2008 | Jeong | 361/719 |
| 7,388,751 B2 * | 6/2008 | Hood et al. | 361/704 |
| 7,447,039 B2 * | 11/2008 | Chao et al. | 361/748 |
| 7,471,518 B2 * | 12/2008 | Gallina et al. | 361/719 |
| 2004/0212963 A1 | 10/2004 | Unrein | |
| 2005/0108877 A1 * | 5/2005 | Peterson | 29/890.03 |
| 2005/0122690 A1 | 6/2005 | Hood et al. | |
| 2005/0243521 A1 | 11/2005 | Li et al. | |
| 2005/0254208 A1 * | 11/2005 | Belady et al. | 361/690 |
| 2007/0188993 A1 * | 8/2007 | Gallina et al. | 361/700 |
| 2009/0040721 A1 * | 2/2009 | Lyon | 361/697 |

* cited by examiner

*Primary Examiner*—Jayprakash N Gandhi
*Assistant Examiner*—Robert J Hoffberg
(74) *Attorney, Agent, or Firm*—Cynthia G. Seal; Jeffrey L. Streets

(57) ABSTRACT

Adapter module securable to a socket frame, integrated circuit module assembly and method for securing a heat dissipation device in direct thermal communication with an integrated circuit module. The socket frame is positioned over a substrate having a land grid array and the frame is secured to the substrate. The frame defines a well for selectively receiving the integrated circuit module in electronic communication with the land grid array. The adapter module is secured to the frame and extends outside the perimeter of the frame. The adapter provides a feature outside the perimeter of the frame for fastening the heat dissipation device. Furthermore, the adapter body is secured to the frame without adding holes through the substrate, such as by extending under the frame to be secured between the frame and substrate, or by extending over the frame to be secured between the frame and fasteners.

17 Claims, 5 Drawing Sheets

METHOD AND APPARATUS FOR SECURING A MICROPROCESSOR AND HEAT SINK USING FEWER MOUNTING HOLES

BACKGROUND OF THE INVENTION

1. Field of the Invention

The present invention relates to connector assemblies for securing a heat dissipation device in thermal communication with a microprocessor that is secured to a circuit substrate, such as a printed circuit board.

2. Description of the Related Art

High performance computer systems and server systems include increasingly complex, high signal speed, integrated circuit devices or microprocessors secured to printed circuit boards to accommodate efficient electronic interconnections within a small spatial footprint. These electronic interconnections are commonly made using a land grid array (LGA) that provides high density, mechanically loaded interconnects between the microprocessor and the printed circuit board. The LGA allows for reliable and efficient interconnection, test and replacement of very costly module configurations while circumventing the inherent reliability and process limitations associated with soldering of large area array packages.

The interconnection of a land grid array of a microprocessor to a printed circuit board involves a high area density of electronic contacts. These contacts must be highly reliable over a range of operating environments. Accordingly, a common method of interconnecting microprocessor to a printed circuit board utilizes a socket that is physically secured to the printed circuit board to precisely align the land grid array of the microprocessor with the land grid array of the printed circuit board, with or without an interposer. Due to the high area density of the contacts in the land grid arrays, the socket must be designed for accurate and stable positioning on the printed circuit board, as well as accurate and stable positioning of the microprocessor within the socket. In order to achieve these objectives, the dimensional tolerances of the socket are very tight.

Furthermore, variations in the mechanical load placed on the electronic contacts of the land grid array should be minimized. Such variations have been reduced by using springs to uniformly distribute the applied load and backing plates to provide support to the back side of the printed circuit board. These mechanical systems may also be responsible for the support of heat sinks in direct contact with the microprocessor to support cooling of the microprocessor during operation.

Still, the demand for precise positioning, loading, and cooling of microprocessors can be at odds with efforts to provide higher performance in less space. For example, the layout of devices on the printed circuit board must consider spatial interference between adjacent components on the board, as well other adjacent components within the same enclosure. Furthermore, increasing the number of holes in the circuit board can reduce the strength of the board and potentially interfere with circuit layout on the board. Socket designs must be efficient to avoid consuming excessive real estate on the printed circuit board and heat sinks must be designed and arranged to work efficiently without employing dimensions that would unduly enlarge the enclosure.

Therefore, there remains a need for an improved method and apparatus for securing microprocessors and heat sinks in computer systems and other consumer and industrial electronics devices. It would be desirable for such a method and apparatus to provide greater flexibility in the installation and design of the individual components, as well as the layout of the entire system.

SUMMARY OF THE INVENTION

The present invention provides an integrated circuit module assembly. The assembly comprises a substrate including a land grid array and a plurality of substrate holes about the perimeter of the land grid array, a backing plate positioned under the substrate directly below the land grid array, a frame positioned over the substrate and circumscribing the land grid array, wherein the frame defines a well, and a plurality of fasteners extending through the plurality of substrate holes to secure the frame and the backing plate to the substrate. An adapter module is secured to the frame and extends outside the perimeter of the frame. In use, an integrated circuit module is selectively secured within the well for electronic communication with the land grid array, and a heat dissipation device such as a heat sink is fastened to the adapter module outside the perimeter of the frame and extends inside the perimeter of the frame for direct thermal communication with the integrated circuit module.

The present invention also provides an adapter module securable to a frame for securing a heat dissipation device in direct thermal communication with an integrated circuit module. The frame is positioned over a substrate having a land grid array and secured to a backing plate positioned under the substrate directly below the land grid array using a plurality of fasteners that extend through a plurality of holes in the substrate about the perimeter of the land grid array. The frame defines a well for selectively receiving and securing the integrated circuit module in electronic communication with the land grid array. In accordance with the invention, the adapter module comprises an adapter body secured to the frame and extending outside the perimeter of the frame. A feature is provided on the body for fastening the heat dissipation device outside the perimeter of the frame and allows the heat dissipation device to extend inside the perimeter of the frame for direct thermal communication with the integrated circuit module. Advantageously, the adapter body is secured to the frame without adding holes through the substrate or requiring additional fasteners, such as by extending under a portion of the frame to be secured between the frame and substrate, or by extending over a portion of the frame to be secured between the frame and the plurality of fasteners.

Still further, the present invention provides a method for fastening a heat dissipation device in direct thermal communication with an integrated circuit module. The method comprises positioning a frame over a substrate including a land grid array and a plurality of substrate holes about the perimeter of the land grid array, wherein the frame circumscribes the land grid array and defines a well, and wherein the socket frame includes a plurality of frame holes in alignment with the plurality of substrate holes; positioning a backing plate under the substrate directly below the land grid array; disposing an adapter module including a plurality of adapter holes directly above or directly below the frame; securing the frame, the adapter module and the backing plate to the substrate using a plurality of fasteners that extend through the plurality of adapter, through the plurality of frame holes and through the plurality of substrate holes; selectively securing an integrated circuit module within the well for electronic communication with the land grid array; and fastening a heat dissipation device to the adapter module outside the perimeter of the frame, wherein the heat dissipation device extends inside the perimeter of the frame for direct thermal communication with the integrated circuit module.

DETAILED DESCRIPTION

Figure 1:
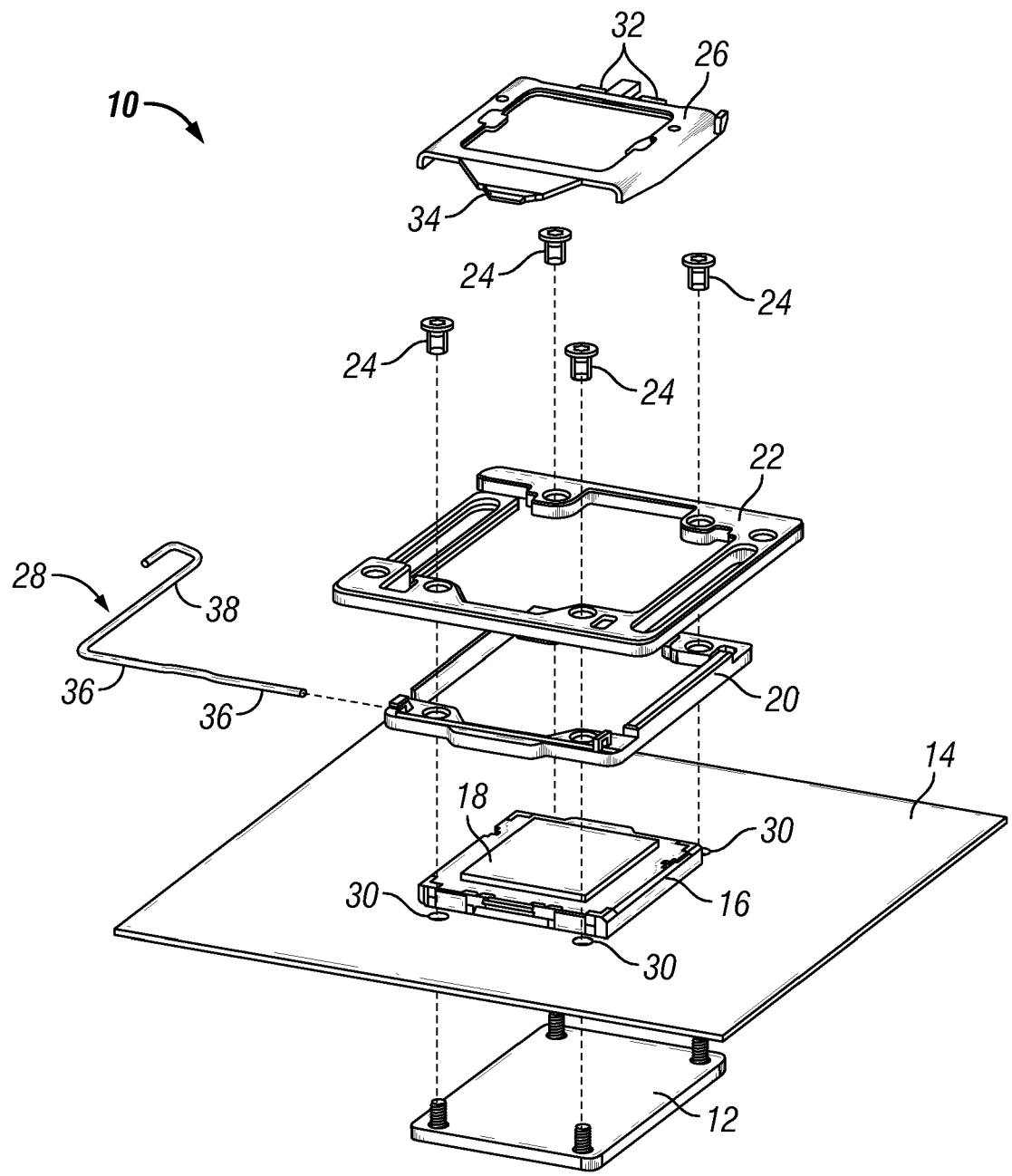
FIG. 1 is an exploded perspective view of a socket frame assembly, including an adapter module secured over the top of the frame.

The present invention provides an adapter module securable to a socket frame for securing a heat dissipation device in direct thermal communication with an integrated circuit module. The socket frame is positioned over a substrate having a land grid array and the frame is secured to a backing plate positioned under the substrate directly below the land grid array. A plurality of fasteners extend through a plurality of holes in the substrate about the perimeter of the land grid array to secure the socket frame and the backing plate. The frame defines a well for selectively receiving and securing the integrated circuit module in electronic communication with the land grid array.

The adapter module comprises an adapter body secured to the frame and extending outside the perimeter of the frame. The adapter body provides a feature, such as a threaded hole, outside the perimeter of the frame for fastening the heat dissipation device, such as using a threaded bolt. Direct thermal communication of the heat dissipation device with the integrated circuit module is accommodated by allowing the heat dissipation device to extend inside the perimeter of the frame.

In accordance with the present invention, the adapter body is secured to the frame without adding holes through the substrate. Preferably, the adapter body is secured to the frame without requiring additional fasteners. In one embodiment, the adapter body extends under a portion of the frame and is secured between the frame and substrate. Typically, the portion of the adapter body extending under the frame will be substantially flat and sufficiently thin to avoid raising the frame out of an operative position for securing the integrated circuit module. However, if the frame includes a shoulder, then the adapter body may include a portion that extends under that shoulder without raising the frame at all. In a second embodiment, the adapter body extends over a portion of the frame and is secured between the frame and two or more of the plurality of fasteners that secure the frame to the backing plate. By extending over the frame, the frame is not raised and there is less potential to interfere with the interconnections between the integrated circuit module and the printed circuit board. In this later embodiment, the adapter body preferably includes a plurality of holes that are alignable with a plurality of holes in the frame that are used to receive the fasteners.

Most preferably, the adapter module will self-align with the frame as these components are positioned and fastened to the substrate. Optionally, this may be accomplished where the adapter module and frame are substantially vertically "nested", meaning that the two or components fit compactly together where one component contains, or is contained in, the other component. Accordingly, the adapter module and the frame are not merely stacked. Rather, the adapter module has a thin member that overlaps with the frame, either under the frame (extending between the frame and the substrate) or over the frame (extending between the frame and the head of the fastener). The thin member may have various configurations, such as a tab, shoulder, or flange.

The present invention also provides an integrated circuit module assembly that utilizes an adapter module. The assembly comprises a substrate, such as a printed circuit board, including a land grid array and a plurality of substrate holes about the perimeter of the land grid array. A backing plate is positioned under the substrate directly below the land grid array and a frame is positioned over the substrate and circumscribing the land grid array to define a well. A plurality of fasteners extends through the plurality of substrate holes to secure the frame and the backing plate to the substrate. The well selectively secures an integrated circuit module for electronic communication with the land grid array, with or without an interposer.

The assembly also includes an adapter module secured to the frame and extending outside the perimeter of the frame. Accordingly, a heat dissipation device, such as a heat sink, may be fastened to the adapter module outside the perimeter of the frame and positioned to extend inside the perimeter of the frame for direct thermal communication with the integrated circuit module. In one embodiment, the adapter module includes a pair of features at opposing positions about the perimeter of the integrated circuit module, and wherein the heat dissipation device is fastened to the adapter module with fasteners that engage the pair of features. The opposing positions may be opposing sides or opposing corners, so long as the heat dissipation device can be stably secured. However, the features may be provided at any position on the adapter module. Non-limiting examples of features that may be used in the adapter module for securing the heat dissipation device include threaded holes, clips, clamps, buckles, shoulders, and tracks. The features may directly engage and secure the heat dissipation device utilizing a "tool-less" method, such as by the features directly clipping an edge of the device or the device directly clipping the feature. Alternatively, the features may secure the device through cooperation with a fastener, such as a screw, bolt, spring, pin, clip, band, or latch arm. Such a fastener may, for example, extend through the heat dissipation device and into secure engagement with the feature of the adapter module. Furthermore, it should be recognized that an adapter module may utilize one or more features to fasten the heat dissipation device, and may include one or more sets of features so that the adapter module may secure a heat dissipation device of various designs or in various orientations. Most preferably, the adapter module circumscribes the frame to increase the strength of the adapter module while maintaining a small profile and footprint.

The heat dissipation device is preferably a heat sink having a plurality of generally parallel cooling fins. Beneficially, the adapter module allows the heat sink to be fastened with the cooling fins running at an angle relative to an axis of the land grid array or parallel to an axis of the land grid array. While a single adapter module may be designed to receive a heat sink at various customizable angle, such an adapter module would likely have a larger than desired footprint on the printed circuit board. Alternatively, a variety of individual adapter modules may be designed for use in the assembly, where each individual adapter module secures a heat sink at a different angle. Similarly, a variety of heat sinks may be secured to the adapter modules, but individual heat sinks may be specially designed in order to orient the contact pads with the integrated circuit module while simultaneously orienting the heat sink fins with the direction of air flow. A significant advantage provided by the adapter is that it allows the heat sink to be secured without adding holes through the substrate.

A heat dissipation device may be fastened in direct thermal communication with an integrated circuit module accordingly to the following method. A frame is positioned over a substrate having a land grid array and a plurality of substrate holes about the perimeter of the land grid array, such that the frame circumscribes the land grid array and defines a well. A backing plate is positioned under the substrate directly below the land grid array. In addition, an adapter module is disposed directly above or directly below the frame, depending upon whether the adapter module is designed to fit over or under the frame. Then, the frame, the adapter module and the backing plate are secured to the substrate using a plurality of fasteners. For example, the fasteners may extend through the adapter module, through the frame, through the plurality of substrate holes, and into the backing plate. Alternatively, the fasteners may be inserted or extend in the other direction to secured the components.

After the frame and adapter module have been secured to the substrate, an integrated circuit module is selectively secured within the well for electronic communication with the land grid array. The integrated circuit module may be secured using various clips, covers or other members as known to those in the art. Finally, a heat dissipation device is fastened to the adapter module, preferably outside the perimeter of the frame, but the heat dissipation device extends inside the perimeter of the frame for direct thermal communication with the integrated circuit module.

FIG. 1 is an exploded perspective view of a socket frame assembly 10. The assembly includes a backing plate 12, a printed circuit board 14, an interposer 16, an integrated circuit module 18, a socket frame 20 forming a well 21, an adapter module 22 having a plurality of adapter holes 23, a plurality of fasteners 24, a cover 26 and a clip 28. The interposer 16 and integrated circuit module 18 are positioned directly over and in alignment with a land grid array 31 on the printed circuit board 14. A plurality of substrate holes 30 through the substrate 14 are positioned about the perimeter of the land grid array 31. Securing the assembly involves use of the fasteners 24 to secure the adapter module 22 over the frame 20, secure the frame 20 against the top surface of the substrate 14, and secure the backing plate 12 against the bottom surface of the substrate 14. Specifically, the plurality of fasteners 24 extend through the plurality of adapter holes 23, through the plurality of frame holes 19 (three of four holes are shown) and through the plurality of substrate holes 30. Before using the integrated circuit module 18, the cover 26 is placed over the integrated circuit module and secured to the frame 20. Typically, the cover 26 may form a hinge 32 on one side for engaging the frame 20 and a hook 34 on the opposite side for securing with the clip 28. The clip 28 is hingeably secured to the frame 20 at two points 36 of the clip and includes a lever portion 38 that can be selectively raised and lowered to release and secure the cover 26, respectively. Accordingly, the clip 28 can release the cover 20, which can then open to allow the integrated circuit module 18 to be replaced.

Figure 2:
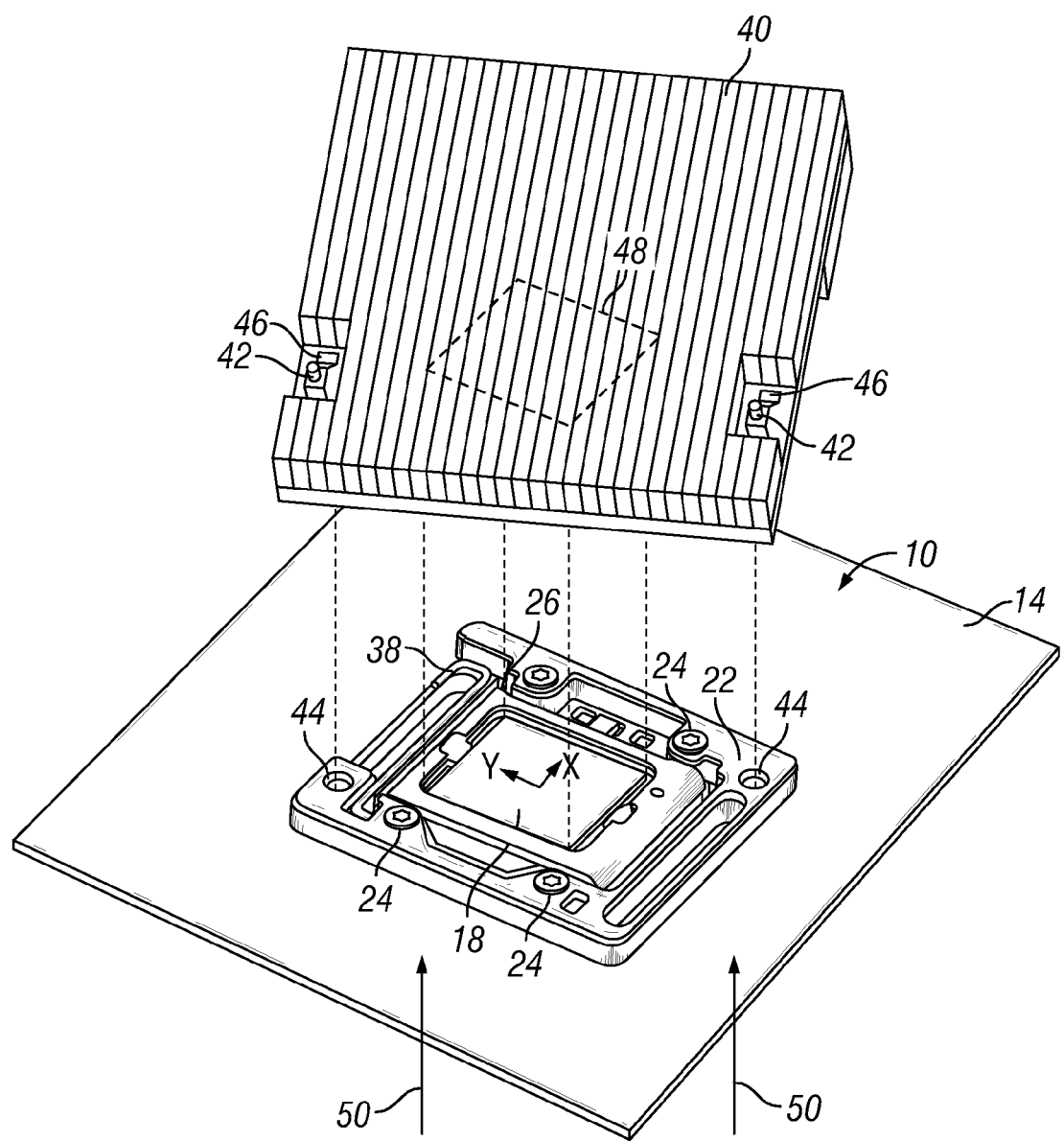
FIG. 2 is an exploded perspective view of a heat sink being fastened to the adapter module at an angle relative to an axis of the integrated circuit module.

FIG. 2 is an exploded perspective view of a heat sink 40 being secured to the adapter module 22 at an angle relative to an axis (X or Y) of the integrated circuit module 18. The heat sink 40 is secured with fasteners 42 which extend through the heat sink for engagement with the features 44 on the adapter module 22. To assist with load leveling, the fasteners 42 may cooperate with a leaf spring 46. A contact pad 48 is formed on the flat, underneath side of the heat sink 40 for making direct contact with the top face of the integrated circuit module 18. The orientation of the heat sink 40 is appropriate for installations where the cooling air flows in the direction of the arrows 50.

Figure 3:
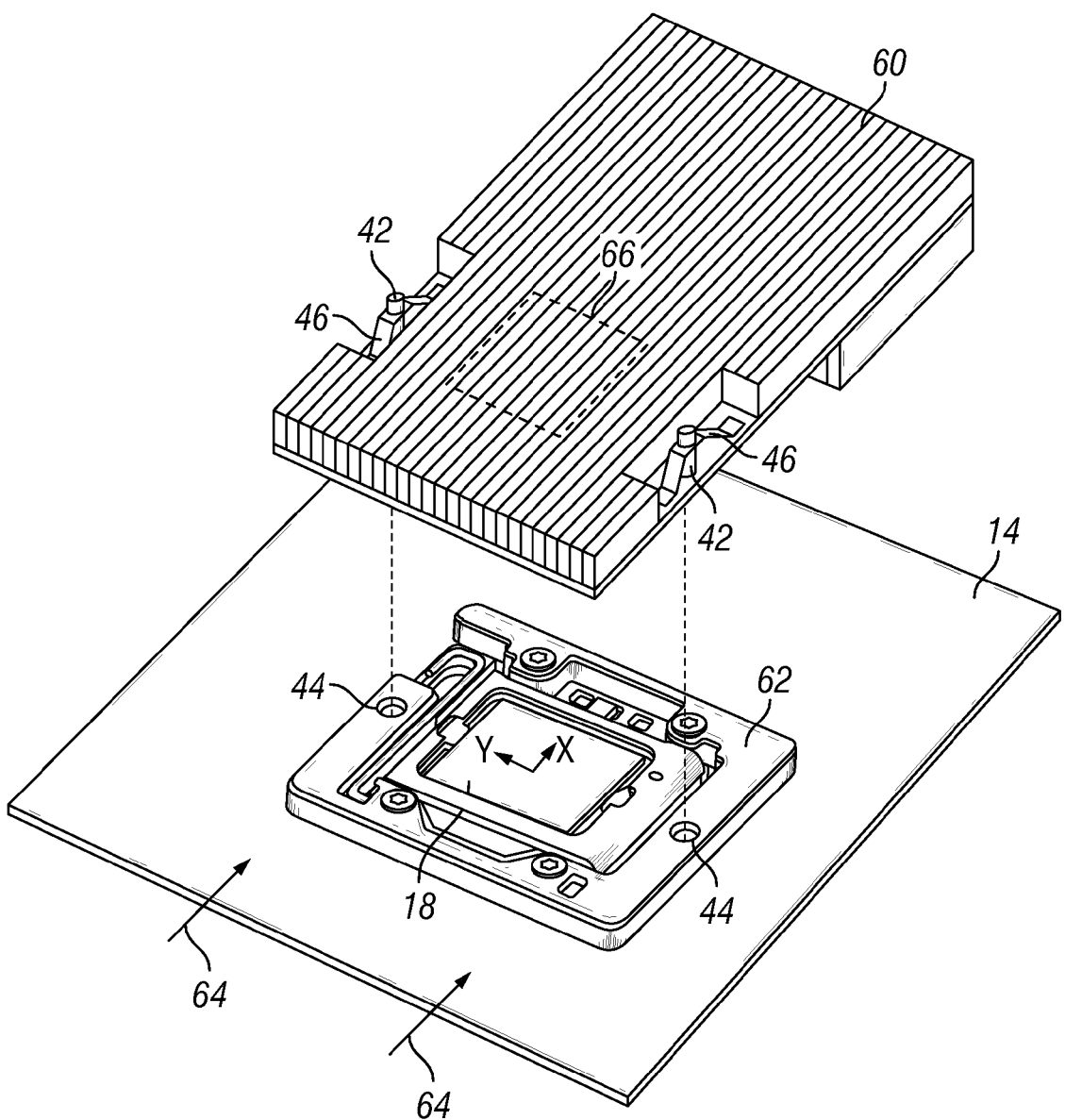
FIG. 3 is an exploded perspective view of a heat sink being fastened to the adapter module in a direction parallel to an axis of the integrated circuit module.

FIG. 3 is an exploded perspective view of a heat sink 60 being secured to an adapter module 62 in a direction parallel to an axis (here, the X axis) of the integrated circuit module 18. The adapter module 62 is substantially similar to adapter module 22 of FIGS. 1 and 2, except that the features 44 for fastening the heat sink 60 have been moved from the opposing corners to the middle of the opposing sides. Accordingly, the heat sink 60 is oriented for installations where the cooling air flows in the direction of the arrows 64. A contact pad 66 is formed on the flat, underneath side of the heat sink 60 for making direct contact with the top face of the integrated circuit module 18.

Figure 4:
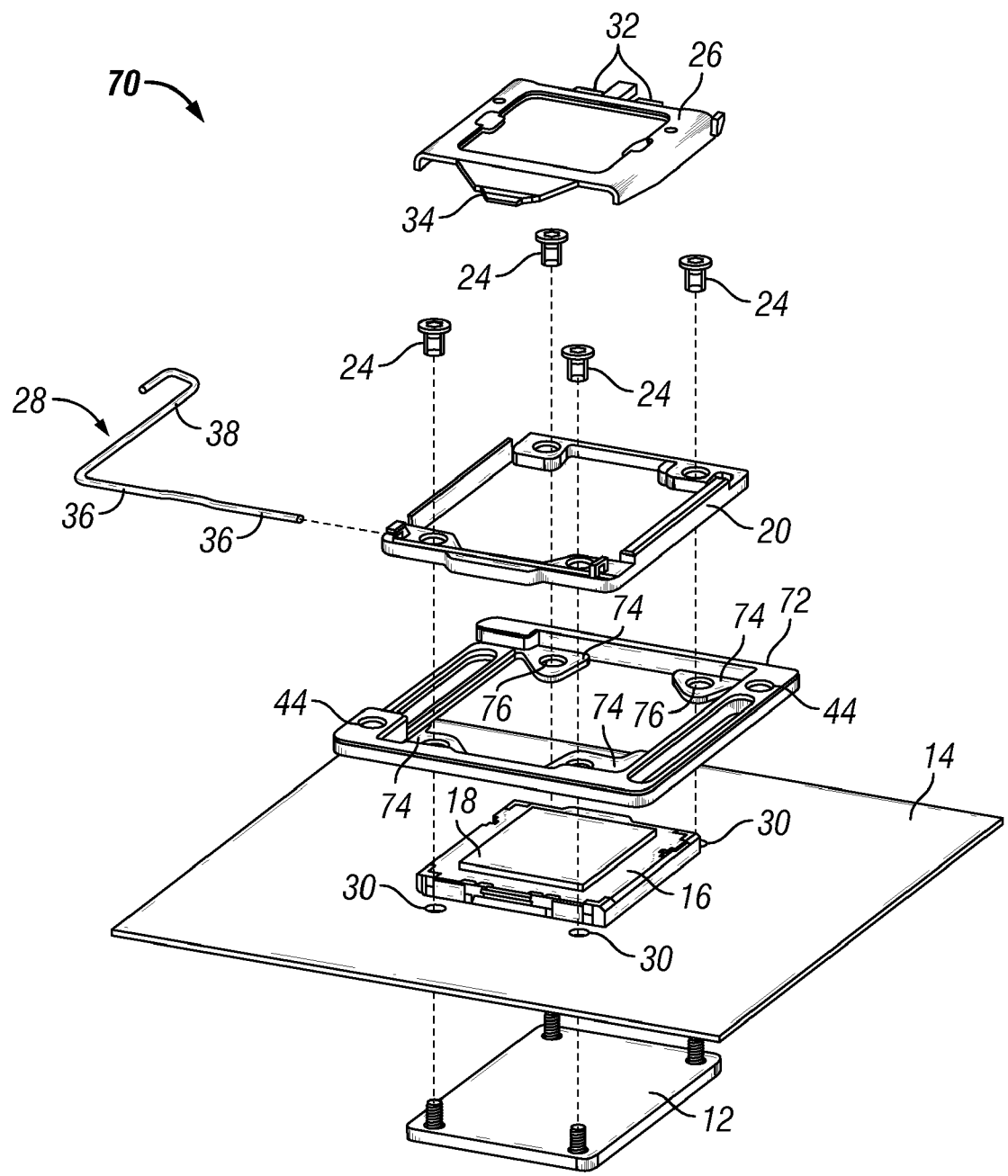
FIG. 4 is an exploded perspective view of a socket frame assembly, including an adapter module secured under the frame.
Figure 5:
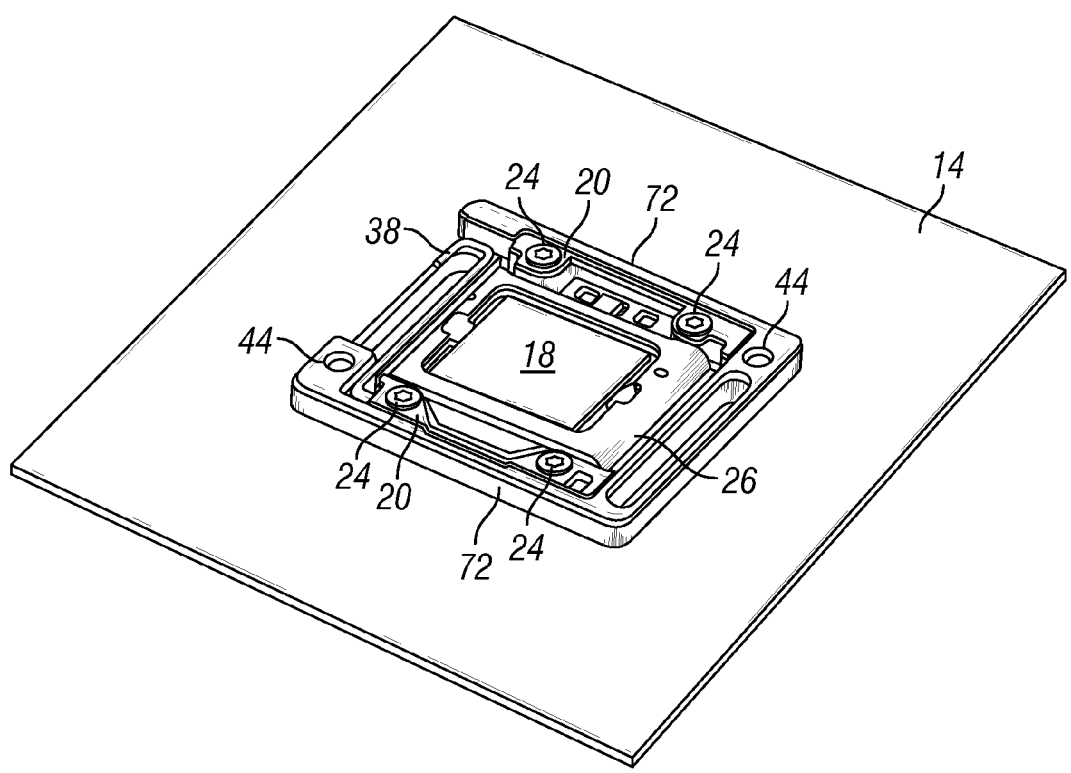
FIG. 5 is a perspective view of the socket frame assembly of FIG. 4, with the adapter module secured under the frame and ready to secure a heat sink.

It should be recognized from FIGS. 2 and 3 that the adapter modules 22, 62 do not interfere with the operation of the clip lever 38 or the operation of the cover 26. Furthermore, the adapter modules 22, 62 do not interfere with the heat sinks 40, 60 making contact with the integrated circuit module 18, which is positioned in the well 21. Therefore, the adapter modules 22, 62 achieve the objective of securing the heat sinks 40, 60 without requiring additional holes through the printed circuit board 14 and without interfering with the normal operation of the socket frame 20. Furthermore, the adapter modules provide additional design flexibility regarding the heat sink orientation FIG. 4 is an exploded perspective view of a socket frame assembly 70, including an adapter module 72 secured under the frame 20. The socket frame assembly 70 is substantially similar to the socket frame assembly 10 of FIGS. 1 and 2, except that the adapter module 72 is configured to be secured under the frame 20 whereas the adapter module 22 of FIGS. 1 and 2 was configured to fit over the frame 20. Accordingly, only the portion of the adapter module 72 that overlaps the frame 20 differs. Specifically, adapter module 72 has thin, tabs 74 that extend under the frame 20, preferably including adapter holes 76 through which the fasteners extend. By extending the tabs 74 inwardly beyond the fasteners, the frame 20 seats against the flat surface of the tabs 74 so that fastening the frame 20 against the substrate 14 will not pressure the frame 20 to bend.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit module assembly, comprising: a substrate including a land grid array and a plurality of substrate holes about the perimeter of the land grid array; a backing plate positioned under the substrate directly below the land grid array; a socket frame positioned over the substrate and circumscribing the land grid array, wherein the frame defines a well, and wherein the socket frame includes a plurality of frame holes; an adapter module including a plurality of adapter holes that is secured to the frame and extends outside the perimeter of the frame; a plurality of fasteners extending through the plurality of adapter holes, through the plurality of frame holes and through the plurality of substrate holes to secure the adapter module, the frame and the backing plate to the substrate; an integrated circuit module selectively secured within the well for electronic communication with the land grid array; and a heat dissipation device fastened to the adapter module outside the perimeter of the frame and extending inside the perimeter of the frame for direct thermal communication with the integrated circuit module.

2. The assembly of claim 1, wherein the substrate is a printed circuit board.

3. The assembly of claim 1, wherein the heat dissipation device is a heat sink.

4. The assembly of claim 1, further comprising:
an interposer socket assembly between the substrate land grid array and the integrated circuit module.

5. The assembly of claim 1, wherein the adapter module includes a pair of features at opposing positions about the perimeter of the integrated circuit module, and wherein the heat dissipation device is fastened to the adapter module with fasteners that engage the pair of features.

6. The assembly of claim 5, wherein the opposing positions are opposing sides.

7. The assembly of claim 5, wherein the opposing positions are opposing corners.

8. The assembly of claim 5, wherein the heat dissipation device is a heat sink having a plurality of generally parallel cooling fins, and wherein the heat sink is fastened to the adapter module with the cooling fins running at an angle relative to an axis of the land grid array.

9. The assembly of claim 5, wherein the heat dissipation device is a heat sink having a plurality of generally parallel cooling fins, and wherein the heat sink is fastened to the adapter module with the cooling fins running parallel to an axis of the land grid array.

10. The assembly of claim 1, wherein the adapter module is secured to the frame without adding holes through the substrate or requiring additional fasteners.

11. The assembly of claim 1, wherein the adapter module extends under a portion of the frame and is secured between the frame and substrate.

12. The assembly of claim 1, wherein the adapter module extends over a portion of the frame and is secured between the frame and the plurality of fasteners.

13. An adapter module securable to a socket frame for securing a heat dissipation device in direct thermal communication with an integrated circuit module, wherein the frame is positioned over a substrate having a land grid array and secured to a backing plate positioned under the substrate directly below the land grid array using a plurality of fasteners extending through a plurality of adapter holes in the adapter module, through a plurality of frame holes in the socket frame and through a plurality of substrate holes in the substrate about the perimeter of the land grid array, wherein the frame defines a well for selectively receiving and securing the integrated circuit module in electronic communication with the land grid array, the adapter module comprising: an adapter body secured to the frame and extending outside the perimeter of the frame, wherein the body provides a feature for fastening the heat dissipation device outside the perimeter of the frame and allowing the heat dissipation device to extend inside the perimeter of the frame for direct thermal communication with the integrated circuit module.

14. The adapter module of claim 13, wherein the adapter body is secured to the frame without adding holes through the substrate or requiring additional fasteners.

15. The adapter module of claim 13, wherein the adapter body extends under a portion of the frame and is secured between the frame and substrate.

16. The adapter module of claim 13, wherein the adapter body extends over a portion of the frame and is secured between the frame and the plurality of fasteners.

17. A method for fastening a heat dissipation device in direct thermal communication with an integrated circuit module, comprising: positioning a frame over a substrate including a land grid array and a plurality of substrate holes about the perimeter of the land grid array, wherein the frame circumscribes the land grid array and defines a well, and wherein the socket frame includes a plurality of frame holes in alignment with the plurality of substrate holes; positioning a backing plate under the substrate directly below the land grid array; disposing an adapter module including a plurality of adapter holes directly above or directly below the frame; securing the frame, the adapter module and the backing plate to the substrate using a plurality of fasteners that extend through the plurality of adapter holes, through the plurality of frame holes and through the plurality of substrate holes; selectively securing an integrated circuit module within the well for electronic communication with the land grid array; and fastening the heat dissipation device to the adapter module outside the perimeter of the frame, wherein the heat dissipation device extends inside the perimeter of the frame for direct thermal communication with the integrated circuit module.

* * * * *